United States Patent [19]
Akamatsu

[11] 3,942,094
[45] Mar. 2, 1976

[54] COMMUTATION CIRCUIT AND APPLICATIONS THEREOF

[75] Inventor: Masahiko Akamatsu, Amagasaki, Japan

[73] Assignee: Mitsubishi Denki Kabushiki Kaisha, Tokyo, Japan

[22] Filed: Oct. 9, 1974

[21] Appl. No.: 513,472

Related U.S. Application Data

[63] Continuation of Ser. No. 387,700, Aug. 13, 1973, abandoned, which is a continuation of Ser. No. 199,190, Nov. 16, 1971, abandoned.

[52] U.S. Cl. ............................ 321/45 C; 307/252 M
[51] Int. Cl.² ........................................ H02M 7/515
[58] Field of Search ............ 321/43, 44, 45 R, 45 C, 321/45 ER, 45 DT; 307/252 M

[56] References Cited
UNITED STATES PATENTS
3,353,085  11/1967  Morgan ................................. 321/43

FOREIGN PATENTS OR APPLICATIONS
30,252  12/1968  Japan .............................. 321/45 C

*Primary Examiner*—William M. Shoop
*Attorney, Agent, or Firm*—Wenderoth, Lind & Ponack

[57] ABSTRACT

The disclosed circuit comprises a thyristor, a diode connected across the thyristor with the opposite polarity, and a commutation capacitor connected across the thyristor through a primary winding of a saturable transformer. The transformer responds to a load current flowing from the thyristor through its secondary winding to produce a reverse current for the thyristor to turn it off. Also there is disclosed the application of the circuit to uni- and bi-directional power control systems.

13 Claims, 31 Drawing Figures

MASAHIKO AKAMATSU, INVENTOR

BY Wenderoth Lind & Ponack
ATTORNEYS

MASAHIKO AKAMATSU,
INVENTOR

MASAHIKO AKAMATSU,
INVENTOR

MASAHIKO AKAMATSU,
INVENTOR

BY Wenderoth, Lind & Ponack
ATTORNEYS 3,942,094

COMMUTATION CIRCUIT AND APPLICATIONS THEREOF

This is a continuation of application Ser. No. 387,700, filed Aug. 13, 1973, now abandoned, which in turn is a continuation of application Ser. No. 199,190, filed Nov. 16, 1971, now abandoned.

BACKGROUND OF THE INVENTION

This invention relates to a commutation circuit for electrically connecting and disconnecting a load to and from a source of direct current and more particularly to a forced commutation circuit for a semiconductor controlled rectifier such as a uni-directional triode thyristor.

In order to turn off unidirectional triode thyristors (which are abbreviated hereinafter to "thyristors") in its conducting state, it is widely practiced to use a commutation capacitor, the discharging current from which reversely biases the thyristor. For example, well known McMurray and Bedford inverters and direct current (DC) choppers called Johnes or Morgan circuits have included a commutation capacitor. At present, it is prevailingly accepted that the commutation capacitor used in such inverters and DC choppers can be most suitably operated with its coefficient of utilization being about 43 percent.

Also there have been already known commutation circuits including a diode (which may be called the "commutation, bypass or flywheel diode") connected in opposite parallel circuit relationship with the thyristor, and a reactor (which may be called the "commutation reactor") connected serially to the commutation capacitor and in parallel to the thyristor. The last-mentioned commutation circuits have only increased in the coefficient of utilization by several percent as compared with the first-mentioned circuits.

SUMMARY OF THE INVENTION

Accordingly it is an object of the invention to provide a new and improved commutation circuit for a thyristor including a commutation capacitor having a coefficient of utilization the theoretical value of which can be 100 percent.

It is another object of the invention to provide a new and improved commutation circuit for a thyristor having a relatively long time interval for which the thyristor is reversely biased and performing the stable commutation operation under low voltage-high current loading.

It is still another object of the invention to provide a new and improved commutation circuit for a thyristor including a commutation capacitor decreased in capacitance.

It is a further object of the invention to provide a new and improved commutation circuit for a thyristor decreased in loss of commutation thereby to increase in efficiency.

It is another object of the invention to provide a new and improved commutation circuit for a thyristor having an operating frequency higher than that previously possible with the loss of commutation remaining unchanged.

The invention accomplishes the above cited objects by the provision of a commutation circuit comprising a semiconductor controlled rectifier connected in a current path formed between a source of direct current and a load, first circuit means for bypassing a forward current for the semiconductor controlled rectifier, and second circuit means for causing a reverse current for the rectifier to flow therethrough, characterized by control transformer means including at least a portion connected in the current path to control the bypassed current flowing through the first circuit means.

The transformer means may preferably include a primary winding connected in the first circuit means and a second winding magnetically coupled to the primary winding and connected in another current path along which the forward current from the semiconductor controlled rectifier or its equivalent flows.

The transformer means may advantageously be an auto-transformer for magnetically coupling the first circuit means to a current path along which the forward current passed through the semiconductor controlled rectifier flows.

Conveniently the first circuit means may include at least a commutation capacitor and the second circuit means may include a semiconductor diode.

BRIEF DESCRIPTION OF THE DRAWINGS

Other objects, features and advantages of the invention will become apparent from the following detailed description taken in conjunction with the accompanying drawings in which:

FIG. 1a is a schematic circuit diagram illustrating the principles of a conventional commutation process for a semiconductor controlled rectifier such as a thyristor;

FIG. 1b is a graphic representation of waveforms developed in the circuit shown in FIG. 1a;

FIG. 3b is a graphic representation of a waveform developed in the circuit shown in FIG. 3a;

FIG. 4b is a graph illustrating waveforms developed in the circuit shown in FIG. 4a;

FIG. 4c is a graph useful in explaining the operation of the transformer shown in FIG. 4a;

FIG. 5a is a schematic wiring diagram of a commutating circuit for a semiconductor controlled rectifier embodying the principles of the invention and which is more practicable than the circuit shown in FIG. 4a;

FIG. 5b is a graph illustrating waveforms developed in the circuit shown in FIG. 5a;

FIG. 6c is a circuit diagram of a modification of the invention;

FIG. 11b is a graph illustrating a waveform of the voltage developed in the circuit shown in FIG. 11a;

FIGS. 12 through 18 are schematic circuit diagrams of power control systems embodying the principles of the invention to control bi-directional power; and FIGS. 19a and b are diagramatic views of different modifications of the transformer which may be used in the invention.

DESCRIPTION OF THE PREFERRED EMBODIMENTS

Figures 1A, 1B:
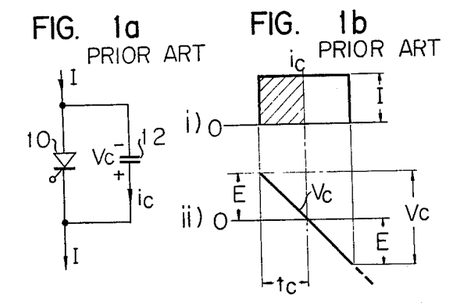

Referring now to FIG. 1 of the drawings, there is illustrated the principles of a conventional commutation process for a semiconductor controlled rectifier. In the following description, the semiconductor controlled rectifiers are assumed to be unidirectional triode rectifiers only for the purpose of illustration. FIG. 1a shows a simplified commutation circuit in the commutation mode. The arrangement illustrated comprises a unidirectional triode thyristor 10 and a commutation capacitor 12 connected across the thyristor 10.

In order to commutate the thyristor 10 having a direct current flowing therethrough, the commutation capacitor 12 preliminarily charged to a predetermined voltage E by any suitable means (not shown) has been connected in opposite parallel relationship with the conducting thyristor 10 by any suitable means also not shown. This results in a circuit configuration as shown in FIG. 1. Then the thyristor 10 is reversely biased with a discharging current $i_c$ from the capacitor 12 to be turned off. Simultaneously the current I turns to the capacitor 12.

As the current I is applied to the capacitor 12, the latter continues to discharge. The capacitor fully discharges at the end of a time interval contributing to the turning off of the thyristor. This time interval is called a "reverse bias time $t_c$".

After its discharge, the capacitor 12 continues to be again charged with the current I but with the polarity reversed from that illustrated. Then the voltage charged on the capacitor 12 reaches a predetermined magnitude. That predetermined magnitude is, in many cases, substantially equal to that of the preliminarily charged voltage across the capacitor 12 although it depends upon the particular circuit configuration. After the capacitor 12 has been charged with the predetermined re-charged voltage with the opposite polarity, the capacitor current further turns to another diode or thyristor (not shown) whereupon the commutation is completed.

Therefore, assuming that the capacitor 12 has an instantaneous voltage $v_c$, the current $i_c$ and voltage $v_c$ for the capacitor will have waveforms i) and ii) illustrated in FIG. 1b. Under these circumstances, it will be apparent that the reverse bias time $t_c$ is expressed by the equation $$t_c = \frac{E \cdot C}{I}$$

where C represents the capacitance of the capacitor 12. This means that only the batched portion as shown in FIG. 1b - i) of the current from the capacitor or a change in electrical charge thereon effectively contributes to the turning off of the thyristor 10.

That is, the commutation capacitor 12 has a coefficient of utilization Kc defined by the product of the current I to be commutated and the reverse bias time $t_c$ divided by the product of a change in voltage $\Delta v_c$ across the capacitor and the capacitance C of the capacitor. That is, the coefficient of utilization Kc is expressed by the equation $$Kc = \frac{I \cdot t_c}{\Delta v_c \cdot C} = \frac{I \cdot t_c}{2E \cdot C} = 0.5 \qquad (2)$$

where $\Delta v_c$ is equal to 2E as shown in FIG. 1b – ii). That is, the capacitor has a coefficient of utilization of 50 percent.

Those commutation circuits operative in the commutation mode as above described involve McMurray and Bedford type inverters and DC choppers known as a Johnes or Morgan circuit. The McMurray and Bedford type inverters frequently used at present have been said to be put in the optimum operation with the coefficient of utilization of 42.5 percent because the current is also delivered to other elements not shown in FIG. 1a.

Figure 2A:
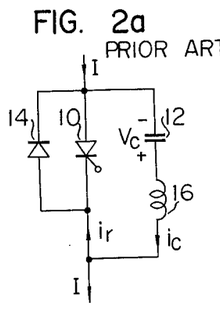
FIGS. 2a and b are views similar respectively to FIGS. 1a and b but illustrating another conventional commutation process.

FIG. 2 wherein like reference numerals and characters designate the components identical to those shown in FIG. 1, illustrates the principles of another conventional commutation process for a unidirectional triode thyristor. A simplified commutation circuit shown in FIG. 2a is operated in the commutation mode and comprises the thyristor 10, a commutation diode 14 connected in opposite parallel circuit relationship with the thyristor 10, and a series combination of commutation capacitor and reactor 12 and 16 respectively connected across the thyristor 10. In the arrangement illustrated, the commutation capacitor 12 repeatedly and alternately discharges and charges in a oscillatory manner through the commutation reactor 16.

Figure 2B:
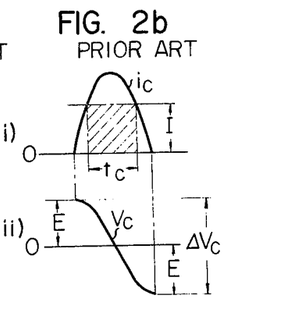

FIG. 2b shows only one positive half cycle of a sinusoidal current thus formed. In a time interval corresponding to that half cycle of the oscillatory current, the oscillatory current $i_c$ for the capacitor 12 exceeds the current I to be commutated. That portion of the time interval where the current $i_c$ exceeds the current I provides a reverse bias time $t_c$ contributing the turn-off of the thyristor 10. The reverse bias time $t_c$ is expressed by the equation $$t_c = 2\sqrt{LC} \cos^{-1} \frac{1}{\sqrt{E \cdot C/L}} \qquad (3)$$

where L is the inductance of the reactor 16.

Considering a waveform i) shown in FIG. 2b, only the current I flowing through the reactor 16 for the time interval of $t_c$ as shown by a hatched portion thereof effectively contributes to the thyristor 10 being turned off. As in the arrangement of FIG. 1a, the capacitor can have a coefficient of utilization Kc expressed by the equation $$Kc = \frac{I \cdot t_c}{\Delta v_c \cdot C} = \frac{I \cdot t_c}{2E \cdot C} = \frac{1}{E\sqrt{C/L}} \cos^{-1} \sqrt{\frac{1}{E \quad C/L}} \qquad (4a)$$

Thus the coefficient of utilization will have its maximum value Kc max equal to 0.56, assuming that I/E C/L equals ⅔.

From the foregoing it will be appreciated that in the conventional commutation processes the commutation capacitor has its coefficient of utilization inherently having the highest possible value amounting only to 50 percent for the arrangement of FIG. 1a or 56 percent for that shown in FIG. 2a. For the most part, conventional commutation circuits have been designed such that the commutation capacitor has a theoretical value of about 43 or 50 percent as its coefficient of utilization because separate reactors and the associated components are disposed therein.

The invention contemplates to impart to the commutation capacitor a coefficient of utilization considerably higher than compared with the prior art practice.

Figure 3A:
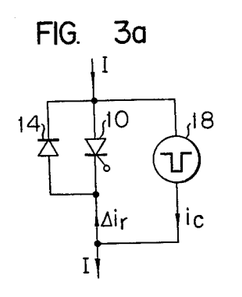
FIG. 3a is a schematic circuit diagram useful in explaining the ideal commutation mechanism for a semiconductor controlled rectifier according to the invention.

FIG. 3 illustrates an ideal commutation process for a thyristor according to the invention. In FIG. 3a, a thyristor 10 has a commutation diode 14 connected in opposite parallel circuit relationship therewith and an ideal source of commutation 18 also connected thereacross.

Figure 3B:
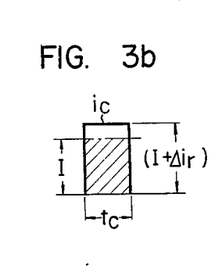

The source 18 is adapted to provide a current $i_c$ which is higher by an amount $\Delta i_r$ than a current I to be commutated, as shown in FIG. 3b, for a reverse bias time $t_c$ required for the now conducting thyristor 10 to be turned off. This causes a current $\Delta i_r$ to be reversely applied to the thyristor 10 while the current I passed at that time through the thyristor is permitted to turn to source 18. Thereafter the current $\Delta i_r$ continues to be reversely supplied to the thyristor 10. Current $\Delta i_r$ flows, as a reverse current, through the thyristor 10 for a short time at the beginning of the reverse bias time $t_c$ or for an accumulation time up to a point in time where the thyristor recovers the reverse blocking ability thereby to accelerate in releasing the carriers accumulated in the thyristor which, in turn, accelerate the turning off of the thyristor. After the thyristor 10 has recovered its reverse blocking ability, the reverse current $\Delta i_r$ also flows through the commutation diode 14 for a predetermined turn-off time ensuring that the thyristor 10 is held at the required minimum reverse voltage.

The ideal commutation process must function to commutate the current and turn off the thyristor as above described in conjunction with FIG. 3 so far as both the energy dissipation and transfer is concerned.

Figure 4A:
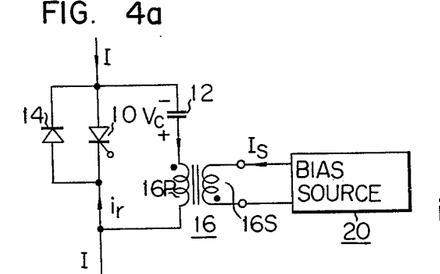
FIG. 4a is a schematic circuit diagram illustrating the principles of the invention.

Referring now to FIG. 4a, there is illustrated the principles of the invention. FIG. 4a shows an arrangement similar to that illustrated in FIG. 3a except that the ideal source of commutation shown in FIG. 3a is replaced by a series combination of a commutation capacitor 12 and a saturable transformer generally designated by the reference numeral 16. The transformer 16 includes a primary winding 16P serially connected to the capacitor 12 and a secondary winding 16S connected across a bias source 20. The dot convention has been employed to indicate the polarity of the instantaneous current or voltage for each transformer winding. The source 20 is operative to apply a biasing current $I_s$ in the direction of the arrow shown in FIG. 4a to the secondary transformer winding 16S to magnetically bias the transformer 16.

Figures 4B, 6C:
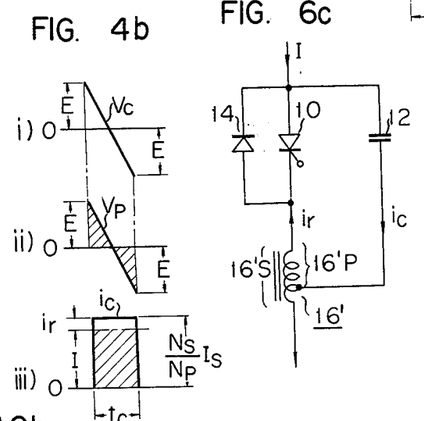

When the transformer 16 has applied to its primary winding 16P a voltage E (see FIG. 4b – i) to which the commutation capacitor 12 has been initially charged with the polarity illustrated in FIG. 4a, a primary current flowing through the primary transformer winding 16P is restricted to such a magnitude that both windings are equal in ampere turns to each other. That is, the primary current $i_c$ is expressed by the equation $$i_c = \frac{N_s}{N_p} I_s \qquad (5)$$

where $N_p$ is the number of turns of the primary winding 16P and $N_s$ is the number of turns of the secondary winding 16S. This primary current $i_c$ is equal to a discharge current from the capacitor 12. Also it is to be noted that the discharge current $i_c$ is preselected to be greater than a current I to be commutated.

Under these circumstances, a current difference $i_r$ expressed by $$i_r = i_c - I \qquad (6)$$

is applied, as a reverse current, to the thyristor 10 to aid in turning it off. After the thyristor 10 has recovered its reverse blocking ability, the same current $i_r$ bypasses the thyristor 10 to flow through the diode 14.

In this way, the capacitor 12 continues to discharge with the constant current expressed by the equation (5) while the transformer 16 has applied thereacross a voltage $v_c$ across the capacitor 12 (see FIG. 4b – i)).

The transformer 16 and particularly the magnetic flux produced in the magnetic core thereof (not shown) will now be described with reference to FIG. 4c wherein the magnetic flux (ordinate) is plotted against an ampere turn AT (abscissa) applied to the transformer. The magnetic flux in the transformer 16 initially put in its negative saturated state $N_s$ responds to the application of the voltage $v_c$ across the capacitor 12 to change in magnitude along a path ascending in the unsaturated region of the transformer as shown at the solid arrow in FIG. 4c. Then the voltage $v_c$ across the capacitor 12 becomes null. Even at that time the magnetic flux level of the transformer 16 is situated in its unsaturated region so that a voltage is reversely induced across the primary winding 16P due to the ampere turns thereof resulting from the energized secondary winding 16S. Also the above equations (1) and (2) are held. Therefore the capacitor 12 continues to charge with the polarity reversed from that illustrated. At the same time, the flux level of the transformer 16 changes along a path descending in the unsaturated region of the transformer as shown at the dotted arrow in FIG. 4c. Eventually the transformer 16 enters the negative saturated region thereof whereby the transformer action is disabled. At that time, the thyristor 10 has applied thereto a forward voltage with no effect and the current I to be commutated is taken over by a separate diode or a different thyristor (not shown) to terminate the charging of the capacitor 12 resulting in the completion of one commutation cycle.

Figure 4C:
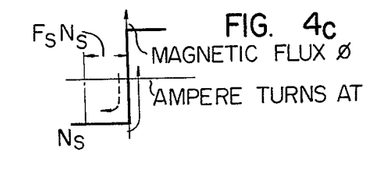

As will readily be understood from FIG. 4c, a magnitude of voltage integrated with time for the transformer 16 remains unchanged between the discharging and charging of the capacitor 12. This means that the transformer 16 is returned back to its negative saturated state just at the point in time where the capacitor 12 has again charged to a voltage equal and opposite to the voltage E to which the capacitor 12 was initially charged with the polarity illustrated. Therefore the voltage $v_c$ across the capacitor 12 and the voltage $v_p$ across the primary transformer winding 16P change in the commutation cycle as shown at waveforms i) and ii) in FIG. 4b while the capacitor current $i_c$ remains unchanged as shown at waveform iii) in FIG. 4b.

Thus the reverse bias time $t_c$ effective for turning off the thyristor can be expressed by the equation $$t_c = \frac{2E \cdot C}{\frac{N_s}{N_p} I_s} \tag{7}$$

where $N_s/N_p\, I_s > 1$. Also the capacitor 12 has its coefficient of utilization Kc expressed by $$Kc = \frac{I \cdot t_c}{\Delta v_c \cdot C} = \frac{1}{2E \cdot C} \cdot \frac{2E \cdot C}{\frac{N_s}{N_p} I_s} = 1.0 \tag{8}$$

for the commutation limit satisfying the relationship $$\frac{N_s}{N_p} I_s - 1 = +0.$$

The "+0" means that the magnitude $$\frac{N_s}{N_p} I_s - 1$$

converges into zero from its positive side.

Thus it will be apparent that the coefficient of utilization Kc provided by the invention amounts to the final value of 100 percent whereas the coefficient obtainable by the prior art practice has a value of 50 percent or 56 percent as previously described. In other words, the invention can effect the ideal commutation function as already described in conjunction with FIG. 3.

While the invention has been described in terms of its ideal circuit configuration and with reference to FIG. 4, it will readily be understood that, in practicing the invention, the capacitor and transformer 12 and 16 respectively inevitably include some inductance, though very low, associated to the connections thereto. That inductance may be necessary in order to control a rate of rise of current (di/dt) upon turning on another semiconductor switch or switches required to form the circuit configuration as shown in FIG. 4a. That switch may be an auxiliary thyristor or another main thyristor although such thyristors are not illustrated. The current I may be alternately commutated to such a main thyristor and the thyristor 10 shown in FIG. 4a.

Figure 5A:
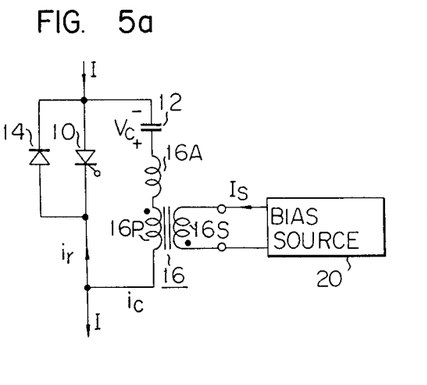

FIG. 5 illustrates an arrangement identical to that shown in FIG. 4a except for a series inductance 16A being connected between the capacitor 12 and primary transformer winding 16P. Like reference numerals and characters have been employed to identify the components identical to those shown in FIG. 4. The inductance 16A may be a series inductance such as the wiring inductance above described, a leakage inductance inherent to the transformer 16 and/or a reactor for controlling the rate of rise of off state voltage.

Figure 5B:
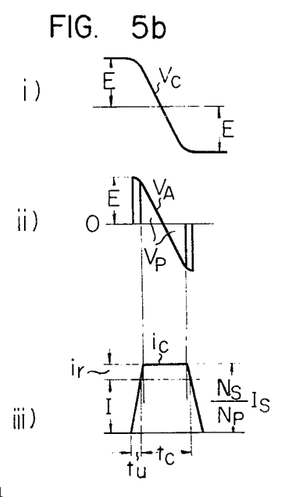

In the arrangement as shown in FIG. 5a, some time necessarily passes away until the current for the capacitor 12 reaches the magnitude defined by the equation (5). During that time, the voltage across the capacitor is applied, as a voltage $v_A$, to the inductance 16A. This is true in the case when the capacitor current decays after the capacitor has re-charged with the opposite polarity. Therefore the capacitor current $i_c$ has a rise time $t_u$ and a decay time substantially equal to the rise time to provide oscillatory current in the form of a frustum as shown at waveform iii) in FIG. 5b. The reverse bias time $t_c$ for the thyristor 10 is defined by a time interval for which the waveform iii) exceeds in magnitude the current I to be commutated. The voltage $v_c$ across the capacitor 12 changes as shown at waveform i) in FIG. 4b, and the voltage $v_p$ across the primary transformer winding 16P has a waveform ii) as shown in FIG. 5b with the voltage $v_A$ across the inductance 16A merged into each end of the waveform of the voltage $v_p$.

Figure 6A:
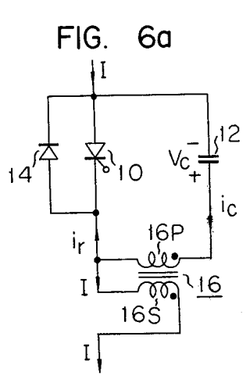
FIGS. 6a and b are views similar respectively to FIGS. 5a and b but illustrating one embodiment of the invention.

FIG. 6 wherein like reference numerals and characters designate the components corresponding to those shown in FIG. 5 illustrates a commutation circuit constructed in accordance with the principles of the invention as above described in conjunction with FIGS. 4 and 5. The arrangement illustrated comprises a semiconductor controlled rectifier shown as the thyristor 10 connected between a source of direct current and a load (not shown) to permit a current I to flow therethrough upon turning it on. The arrangement further comprises first circuit means including the commutation capacitor 12 to bypass or forward current I for the thyristor and second circuit means including the semiconductor diode 14 to permit a reverse current for the thyristor 10 to flow therethrough. A control transformer 16 is provided including a primary winding 16P connected between the capacitor 12 and the thyristor 10 and a secondary winding 16S serially connected to the thyristor 10. The current I leaving the thyristor 10 is adapted to flow through the secondary transformer winding 16S to magnetically bias the transformer 16. Thus the form of the invention as shown in FIG. 6a may be called the "self-bias type." In many cases, the current I may be a load current.

Figure 6B:
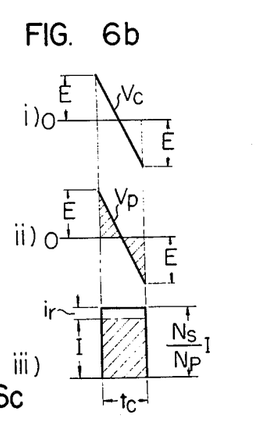

SInce the secondary current $I_s$ shown in FIG. 5a corresponds to the current I shown in FIG. 6a, the capacitor current $i_c$ (see waveform iii), FIG. 6b) can be expressed by $$i_c = \frac{N_s}{N_p} I \tag{9}$$

and the reverse current $i_r$ for the thyristor 10 flowing through the diode 14 can be expressed by $$i_r = \frac{N_s - N_p}{N_p} I \tag{10}$$

If the current I can be regarded to be constant during the commutation period as for inductive loads, then the capacitor is permitted to charge up to a voltage equal and opposite to the voltage E initially charged thereon (see waveform i), FIG. 6b). When the capacitor has charged to that voltage, the reverse bias time $t_c$ will terminate. Thus it is expressed by $$t_c = \frac{2E \cdot C}{(1+n)I} \tag{11}$$

where $$n = \frac{N_s - N_p}{N_p}.$$

On the other hand, the coefficient of utilization Kc of the capacitor is expressed by the equation $$Kc = \frac{I \cdot t_c}{\Delta v_c \cdot C} = \frac{I}{2E \cdot C} \cdot \frac{2E \cdot C}{(1+n)I} = \frac{1}{1+n} \qquad (12)$$

Putting $n = 0$ in the equation (12) yields $Kc=1.0$. That is, the coefficient of utilization $Kc$ has its ideal value of 100 percent. Even by taking account of an exciting current for the transformer 16 and the inductance 16A, the $n$ may be of from 0.1 to 0.33 with the result that the coefficient of utilization may readily range from 90 to 75 percent.

The transformer 16 shown in FIG. 6a may be an auto-transformer 16', as illustrated in FIG. 6c. In this case, the capacitor 12 is connected to the junction of the primary and secondary windings 16P and 16'S respectively.

The principles of the invention as above described are effectively applicable to DC power control systems as shown in FIGS. 7 through 11 wherein like reference numerals designate the identical or similar components.

Figure 7:
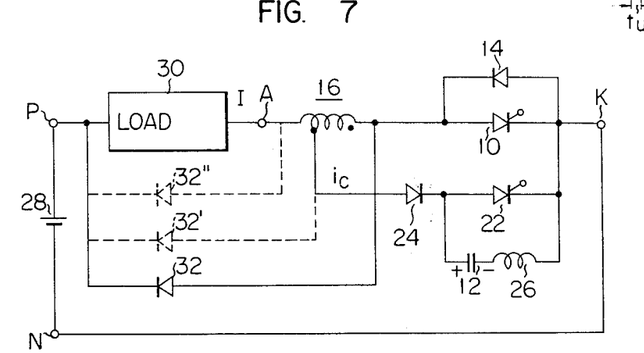
FIG. 7 is a schematic circuit diagram of a power control system embodying the principles of the invention to control a DC power.

The arrangement shown in FIG. 7 comprises a DC chopper including a main thyristor 10 and a saturable transformer 16, in this case, an auto-transformer serially connected across a pair of main positive and negative terminals A and K respectively. The DC chopper further includes a semiconductor commutation diode 14 connected in opposite parallel relationship with the thyristor 10, and a series combination of an auxiliary thyristor 22 and auxiliary semiconductor diode 24 connected between the cathode electrode of the main thyristor 10 and an intermediate tap on the series transformer 16. The thyristor and diode 22 and 24 respectively are identical in polarity to the thyristor 10. The auxiliary thyristor 22 has a series combination of commutation capacitor and reactor 12 and 26 respectively connected thereacross. The components 10, 12, 14 and 16 are identical to those shown in FIG. 6.

The arrangement further comprises a source of direct current 28, including a pair of positive and negative terminals P and N respectively, a load 30 connected across the terminals P and A, and a main semiconductor diode 32 connected between the positive terminal P and the junction of the transformer and thyristor 16 and 10 respectively. The negative terminals N and K are connected together. If desired, the main diode 32 may be connected between the positive source terminal P and the positive chopper terminal A or the intermediate tap on the transformer 16 as shown in dotted lines as 32' and 32 in FIG. 7.

In operation, the source 28 has initially charged the commutation capacitor 12 with the illustrated polarity through the load 30, one portion of the auto-transformer 16 winding, the auxiliary diode 24 and the commutation reactor 26. Then the main thyristor 10 is fired by a suitable means (not shown) to cause the source 28 to supply a current I to the load 30 through the transformer 16 and the now conducting thyristor 10. Since the transformer 16 is preselected to be saturated within a very short time interval required for the commutation, the transformer 16 has a magnetic flux immediately reaching its negative saturated magnitude.

Following this, the auxiliary thyristor 22 is fired by suitable means (not shown) to cause the initially charged capacitor 12 to discharge in the oscillatory manner through a closed loop including the capacitor 12, the reactor 26 and the auxiliary thyristor 22 by the action of the capacitor and reactor. Then the capacitor 12 again charges but with the polarity reversed from that illustrated. The capacitor 12 thus charged tends to discharge through the auxiliary diode 24. At that time, assuming that the reactor 26 has a negligible inductance, the resulting circuit configuration is quite identical to that shown in FIG. 6c. Thus it will be appreciated that the arrangement of FIG. 7 is operated in the commutation mode according to the principles of the invention.

More specifically, the oppositely charged capacitor 12 supplies a capacitor current $i_c$ to the auxiliary diode 24 and also a reverse current $i_r$ to the thyristor 10 or the diode 14 as above described in conjunction with FIG. 6a. On the other hand, the terminal A has flowing thereinto a load current I considered to be constant in magnitude by the action of an inductance included in the load 30. When the voltage across the capacitor 12 has the polarity reversed from that illustrated, a voltage is induced across the transformer 16 in the positive direction shown at the arrow for the current $i_r$ in FIG. 7. Then as the capacitor 12 again charges with the polarity illustrated, a voltage is induced across the transormer 16 and in a direction opposite to that illustrated, so that the flux level of the transformer 16 is again moved in the direction of negative saturation. At the time where the capacitor 12 has charged to the original voltage having the illustrated polarity, the transformer 16 reaches the negative saturation whereupon the commutation cycle is completed. Thereafter the load current I circulates through the main diode 32 because the transformer 16 is in its negative saturated state. This is also true when the main diode 32 is disposed at its position 32' or 32" as shown in dotted lines in FIG. 7. Then the main thyristor 10 can be fired to repeat the process as above described.

In the arrangement of FIG. 7 it may also be considered that in the commutation mode the main thyristor 10 continues to be reversely biased by the following mechanism: After the capacitor 12 has been inverted in polarity, the load current I flows into that portion of the transformer 16 winding disposed between the terminal A and the auxiliary diode 24 to act as a current for re-charging the capacitor. The current I provides a primary current for the transformer 16 to induce across that winding portion therof disposed on the side of the main thyristor 10 an electromotive force providing the reverse bias current for the latter as will readily be understood by the dot convention denoted beside the transformer.

Figure 8:
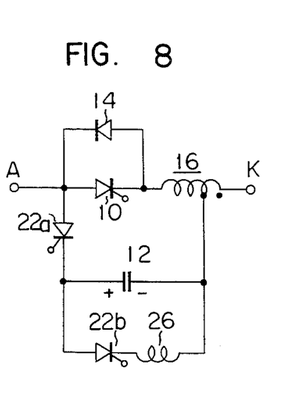
FIG. 8 is a fragmental circuit diagram of a modification of the arrangement shown in FIG. 7.

In the arrangement shown in FIG. 8 the saturable transformer 16 is connected between the main thyristor 10 and the terminal K rather than the terminal A. The capacitor 12 is connected on one side to the main thyristor 10 through an auxiliary thyristor 22a opposite in polarity to the main thyristor 10 and on the other side to an intermediate tap on the transformer 16. The capacitor 12 also has a series combination of auxiliary thyristor 22b and commutation reactor 26 connected thereacross with both auxiliary thyristors being similar in polarity to each other.

In operation, the firing of the auxiliary thyristor 22b causes the capacitor 12 initially charged with the polarity illustrated to re-charge with the opposite polarity in the same manner as above described in FIG. 7. Then the auxiliary thyristor 22a is fired to put the arrangement in a circuit configuration identical to that shown in FIG. 6c. Thus the commutation cycle proceeds.

Figure 9:
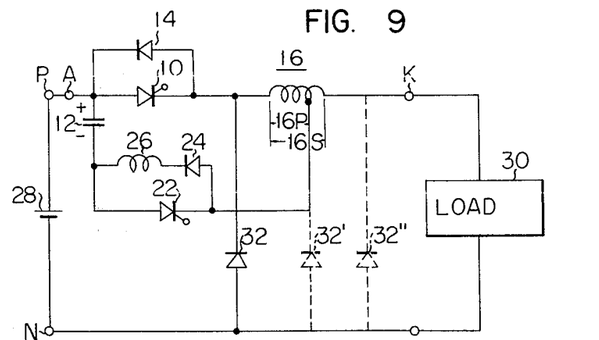
FIG. 9 is a circuit diagram similar to FIG. 8 but illustrating a modification of the arrangement shown in FIG. 8.

The arrangement of FIG. 9 is different from that shown in FIG. 7 chiefly in that in FIG. 9, the capacitor 12 interconnects the anode electrodes of the thyristors 10 and 22, the reactor 26 is serially connected to the diode 24 rather than to the capacitor 12, and the load is connected across the terminals K and N. Further the auxiliary thyristor 22 is directly connected at the cathode electrode to the intermediate tap on the transformer 16 and the main diode 32 is connected at the anode electrode to the negative terminal N and at the cathode electrode to the junction of the main thyristor 10 and transformer 16. As in the arrangement of FIG. 7, the diode 32 may be disposed at positions 32' or 32" shown in dotted lines in FIG. 9.

In operation, the auxiliary thyristor 22 has been first fired to charge the capacitor 12 with the polarity illustrated. Then the main thyristor 10 is fired to permit the source 28 to supply a current to the load 30 through the now conducting thyristor 10 and the transformer 16. Immediately after the main thyristor 10 has been fired, the auxiliary thyristor 22 is automatically turned off and the capacitor 12 charges with the polarity reversed from that illustrated through the main thyristor 10, the auxiliary diode 24 and the reactor 26. This causes the thyristor 10 to be reversely biased by the capacitor 12 and to be turned off. At that time the auxiliary thyristor 22 is fired to put the arrangement in a circuit configuration quite identical to that shown in FIG. 6. Thus the arrangement is operated in the commutation mode.

After the completion of the commutation cycle, the commutation capacitor 12 is in its charged state with the polarity illustrated, and repeats the process as above described.

Figure 10A:
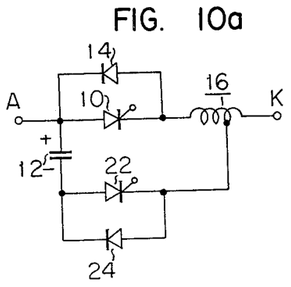
FIGS. 10a and b are fragmental circuit diagrams of different forms of one portion of the arrangement shown in FIG. 9.
Figure 10B:
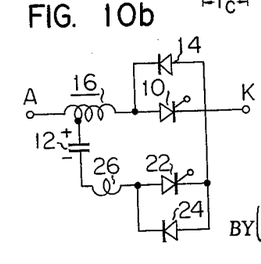

FIGS. 10a and b show different modifications of the arrangement illustrated in FIG. 9. In FIG. 10a, the reactor 26 shown in FIG. 9 is omitted and instead, the saturated inductance provided by the transformer 16 plays the role of such a reactor.

In FIG. 10b, the transformer 16 is connected to the positive terminal A rather than to the negative terminal K and has the intermediate tap thereon connected to the capacitor 12 subsequently connected to both auxiliary thyristor and diode 22 and 24 respectively through the reactor 26. This measure is effective for controlling the rate of rise of current (di/dt) upon turning on the auxiliary thyristor 22. In the commutation mode, the arrangement is put in a circuit configuration corresponding to a combination of the circuit configurations shown in FIGS. 5 and 6 as already described.

Figure 11A:
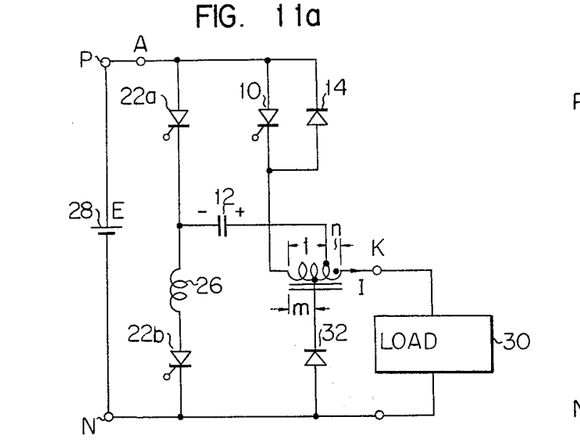
FIG. 11a is a view similar to FIG. 7 illustrating another modification of the arrangement shown in FIG. 7.

Referring now to FIG. 11a, it is seen that the first auxiliary thyristor 22a, the commutation reactor 26 and the second auxiliary thyristor 22b are serially connected in the named order across the positive and negative terminals P and N of the source 28 through the terminal A. The main thyristor 10 connected in opposite parallel circuit relationship with the diode 14 is connected through the saturable transformer 16 and the load 30 to the negative terminal N of the source 28. The transformer 16 has an intermediate tap thereon connected to the negative terminal N through the main diode 32 and another intermediate tap thereon connected through the capacitor 12 to the junction of the first auxiliary thyristor and reactor 22a and 26 respectively.

The arrangement is particularly suitable for controlling a load supplied with a high current from a source of low voltage, for example, for controlling fraction motors for vehicles supplied from their batteries. It is advantageous in that the capacitor 12 can charged with a high voltage as desired without the charged voltage restricted by the source voltage E.

Figure 11B:
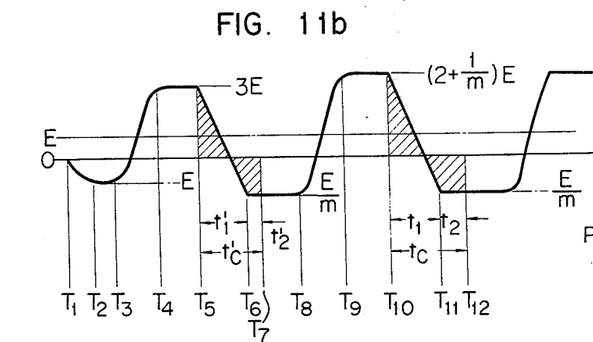

The operation of the arrangement will now be described in conjunction with FIG. 11b. At a point in time $T_1$, the first auxiliary thyristor 22a has been fired to charge the capacitor 12 through the transformer 16 and the load 30 until the capacitor 12 has a charged voltage thereacross equal to the source voltage E and having the polarity reversed from that illustrated. At that time the auxiliary thyristor 22a is reversely biased by the charged capacitor 12 to be turned off and the transformer 16 reaches its negative saturated state. If the capacitor voltage $v_c$ with the polarity illustrated is assumed to be positive, the voltage $v_c$ has a magnitude of $-E$ at a time $T_2$ as shown in FIG. 11b.

Then at a time $T_3$ the thyristor 10 and 22b are fired. The firing of the main thyristor 10 immediately causes the source 28 to supply a load current I to the load 30 through the now conducting thyristor 10 and the transformer 16 because the latter is in its negative saturated state. On the other hand, during the conduction of the auxiliary thyristor 22b, the capacitor 12 is charging with the illustrated polarity in an oscillatory manner through a loop including the capacitor 12, the reactor 26, the now conducting thyristor 22b, the diode 32 and that winding portion of the transformer 16 disposed between the two intermediate taps. Since the voltage $v_c$ on the capacitor 12 oscillates about the value of $+E$ and has been initially of the value of $-E$, the voltage $v_c$ reaches its value of $+3E$ at a time $T_4$ after one half period of the natural oscillation in the abovementioned loop. Thus the thyristor 22b is reversely biased to be turned off.

When the auxiliary thyristor 22a is fired at a time $T_5$, the arrangement is put in a circuit configuration as shown in FIG. 6 with the capacitor 12 having its initial charge voltage of $+3E$. Thus the transformer 16 is not saturated unless the capacitor voltage $v_c$ decreases to a value of $-3E$. Under these circumstances, the capacitor 12 tends to charge up to its voltage $v_c$ of $-3E$ with the polarity reversed from that illustrated while the diode 14 is in its conducting state.

It is assumed that the transformer 16 has a turn ratio of $m$ between that portion of the winding disposed between the thyristor 10 and the diode 32 and the remaining portion thereof. Under the assumed condition, the main diode 32 does not conduct before the winding portion labelled $m$ has a voltage of E. The operation of the arrangement will now be described in conjunction with different values of $m$ $$A) \quad \frac{1}{m} < 3$$

The capacitor 12 negatively charges to its voltage $v_c = -E/m$. This occurs at a time $T_6$ temporally spaced from the time $T_5$ by a time interval of $t'_1$. After the voltage $v_c$ has reached its value of $-E/m$, the capacitor current drops to a zero value, but the transformer 16 does not yet reach its negative saturated state. Accordingly, a time interval of $t'_2$ elapses for which both thyristor and diode 10 and 14 respectively have currents flowing therethrough. That time interval of $t'_2$ terminates at a time $T_7$ where the transformer 16 reaches its nagative saturated state. After the transformer 16 has been negatively saturated, the diode 14 is turned off and only the main thyristor 10 has the current flowing therethrough. In other words, the sum of the time interval $t'_1$ for which the capacitor voltage $v_c$ is decreasing and the time interval $t'_2$ just described provides a first reverse bias time $t'_c$ for the thyristor 10.

Then at a time $T_8$ the main and auxiliary thyristors 10 and 22b respectively are again fired to cause the source 28 to supply the load current to the load 30 while charging the capacitor 12 in the oscillatory manner from the source 28 through the reactor 26 as above described. In this case, the capacitor voltage $v_c$ had its initial value of $-E/m$ so that at a time $T_9$ after one half period of the natural oscillation, the capacitor 12 positively charges to its voltage $v_c$ having a value expressed by $$v_c^+ = \left(2 + \frac{1}{m}\right) E \qquad (13)$$

At a time $T_{10}$ the auxiliary thyristor 22a is fired to put the arrangement in its circuit configuration as shown in FIG. 6. Under these circumstances, the capacitor voltage $v_c$ changes toward the negative direction until the main thyristor 10 is turned on at a time $T_{11}$ where the voltage $v_c$ has a value of $-E/m$. At that time the transformer 16 is still unsaturated so that a time interval $t_1$ during which the voltage $v_c$ decreases is followed by another time interval $t_2$ for which the diode 14 also conducts the current. The time interval $t_2$ is called hereinafter a continued commutation period or time and terminates at a time $T_{12}$. The sum of the time intervals $t_1$ and $t_2$ provides the succeeding reverse bias time $t'_c$ for the main thyristor 10.

Thereafter the process as above described is repeated.

B) $5 < \frac{1}{m} \geq 3$

The process as above described is repeated until the time $T_5$ is reached. Thereafter the capacitor 12 charges to its voltage $v_c$ having a value of $-3E$.

Then the main and auxiliary thyristors 10 and 22b respectively are fired to permit the voltage $v_c$ to reach a value of $+5E$. Thereafter the auxiliary thyristor 22a is fired to cause the capacitor voltage $v_c$ to reach a value of $-E/m$. A further firing of both thyristors 10 and 22b leads to $$v_c = \left(2 + \frac{1}{m}\right) E.$$

Then the capacitor voltage $v_c$ repeatedly changes between the positive value $$v_c^+ = \left(2 + \frac{1}{m}\right) E$$

and the negative value of $$v_c^- = \frac{E}{m}$$

as the process proceeds.

C. Any value of $m$

The capacitor 12 has the steady-state charged voltages expressed by the equations (12) and (13) respectively. As $1/m$ increases, that time interval at the end of which the voltage $v_c$ reaches either of the steady state values is prolonged in terms of one system cycle, assuming that the transformer 16 is satisfactory in the interlinkage of the magnetic flux with its winding and negligibly low in loss.

Considering the reverse bias time $t_c$, the time interval $t_1$ during which the capacitor voltage decreases is calculated at $$t_1 = \frac{(v_c^+ - v_c^-) C}{(1+n) I} = \frac{2(1 + \frac{1}{m}) E \cdot C}{(1+n) I} \qquad (14)$$

from the equations (10), (12) and (13). Also, on the basis of the condition that an absolute value of time integrated voltage for the transformer remains unchanged for the positive and negative voltages, the continued reverse bias time or period $t_2$ can be calculated at $$t_2 = \frac{2(1+m) EC}{(1+n) I} \qquad (15)$$

assuming that the current I is of a fixed value. Summing the equations (14) and (15) yields the total reverse bias time $t_c$ expressed by $$t_c = \frac{2(2 + m + \frac{1}{m}) EC}{1+n} \cdot \frac{1}{I} \qquad (16)$$

for $0 < n$ and $0 < m < 1 + n$. (17)

From the above inequalities (17) it will be apparent that the smaller both $m$ and $n$ the longer the reverse bias time $t_c$ will be and the commutation capacitor will charge a to higher voltage.

Since the capacitor voltage $v_c$ can change by $$\Delta v_c = 2 \left(1 + \frac{1}{m}\right) E,$$

the capacitor has its coefficient of utilization $K_c$ expressed by $$K_c = \frac{I t_c}{\Delta v_c C} = \frac{1 + \frac{1+m}{1+1/m}}{1+n} \qquad (18)$$

It is noted that the $K_c$ may be greater than unity. This is because the calculation of the $K_c$ is effected by containing in the reverse bias time $t_c$ the time interval $t_2$ for which the thyristor is reversely biased by the action of the associated transformer alone. By using the equation (14) for the time interval $t_1$, the coefficient of utilization $K'_c$ is calculated at $$K'c = \frac{I t_c}{\Delta v_c \cdot C} = \frac{1}{n+1} \qquad (19)$$

The equation (19) is identical to the equation (12) obtained with the basic circuit as shown in FIG. 6a.

As above described, the main thyristor is actually biased in the reverse direction for the time interval including that time interval $t_2$ resulting from the action of the transformer alone. Thus it will be appreciated that the larger the $m$ the smaller the volt-ampere capability required for the capacitor will be. However, the $m$ and the volt-ampere capability of the capacitor must be determined by collectively considering the rating of the capacitor commercially available and others.

It is a very important feature of the invention that there is provided the continued commutation period $t_c$ during which the thyristor is reversely biased by the action of the transformer alone. It is to be noted that such a feature is not inherent only to the arrangement of FIG. 11. That feature can be generally realized by additionally providing means for clamping the reverse voltage induced across the transformer 16 by means of the cooperation of the main thyristor 10 with the opposite parallel diode 14 within the time interval for which the transformer is in its unsaturated state.

While the invention has been illustrated and described in conjunction with a DC power control system for controlling a unidirectional output current the same is equally applicable to power control systems for controlling a bidirectional output current as shown in FIGS. 12 through 18 wherein like reference numerals designate the components identical or similar to those illustrated in FIGS. 7 through 11. The invention applied to the latter control systems has a variety of its applications by utilizing direct current-to-alternating current conversion, reversible DC power control or pulse-width modulation.

Figure 12:
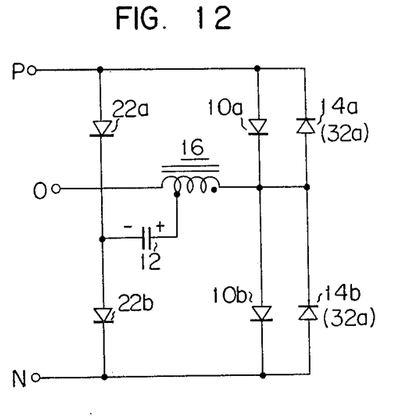

The arrangement shown in FIG. 12 comprises a pair of main thyristors 10a and b serially interconnected across a pair of positive and negative terminals P and N respectively of a source of direct current not shown. Each of the main thyristors 10a and b has one diode 14a or b connected in opposite parallel circuit relationship therewith to serve also as the main diode 32a or b. The arrangement further comprises a pair of auxiliary thyristors 22a and b serially interconnected across the terminals P and N, and the saturable transformer 16 connected at one end to the junction of the main thyristors 10a and b and therefore that of the diodes 14a and 14b and at the other end to the output terminal 0. As in the arrangement of FIG. 6a or c, the transformer 16 is of a self-bias type. The commutation capacitor 12 is connected on one side to an intermediate tap on the transformer 16 and on the other side to the junction of the auxiliary thyristors 22a and b. All of the thyristors are identical in polarity to one another.

Assuming that, as in the arrangement of FIG. 11, a load current is being suplied from the positive terminal P through the fired thyristor 10a and the transformer 16 to the output terminal 0 with the capacitor 12 charged with the polarity illustrated, the transformer 16 is in its positive saturated state. Then the firing of the auxiliary thyristor 22a causes the voltage with the illustrated polarity across the capacitor 12 to be applied to the thyristor 10a through the transformer 16 to turn it off resulting in the initiation of the commutation process as previously described in conjunction with FIGS. 6a and b.

On the other hand, when the load current is supplied from the negative terminal N through the conducting thyristor 10b and the transformer 16 to the output terminal 0, the transformer 16 is in its negative saturated state, while the capacitor 12 has already been charged with the polarity reversed from that illustrated. The firing of the auxiliary thyristor 22b repeats the process as above described in conjunction with the firing of the auxiliary thyristor 22a.

Figure 13:
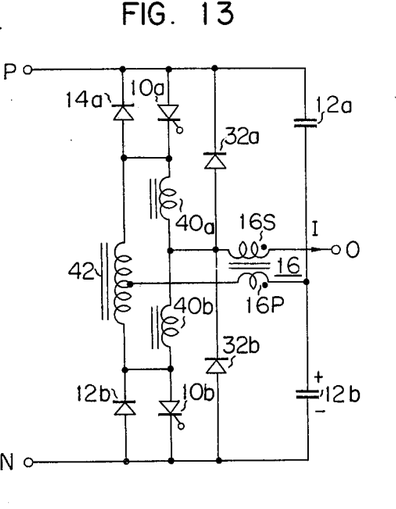

In the arrangement shown in FIG. 13, a serial combination of thyristor 10a and saturable reactor 40a is serially connected to a similar serial combination of saturable reactor 40b and thyristor 10b across the positive and negative terminals P and N respectively with the junction of both reactors 40a and b connected through the secondary winding 16S of the saturable transformer 16 to the output terminal 0. Each of these series combinations has the main diode 32a or b connected thereacross and opposite in polarity to the associated thyristor.

The diode 14a connected across the thyristor 10a with the opposite polarity is connected by a commutation transformer 42 to the diode 14b similarly connected across the thyristor 10b. The transformer 42 includes a center tap connected through the primary transformer winding 16P to the junction of two commutation capacitors 12a and b serially connected across the terminals P and N.

Assuming that the thyristor 10a is conducting to cause the current I from the positive terminal P to be supplied to the output terminal 0 through the conducting thyristor 10a, the reactor 40a and the secondary transformer winding 16S, the capacitor 12b is charged with the polarity illustrated while the capacitor 12a is in its discharged state. In addition, the saturable reactor 40a is in its saturated state but the reactor 40b and commutation transformer 42 are in their unsaturated state. Also the transformer 16 has reached its negative saturated state.

Then the firing of the thyristor 10b renders a potential at the center tap on the commutation transformer 42 equal to a potential intermediate the potentials at the source terminals P and N. Therefore the capacitor 12b tends to discharge toward the center tap on the commutation transformer 42. Similarly the capacitor 12a tends to charge from the source terminal P through the center tap on the commutation transformer 42. At that time, the charging and discharging respectively of the capacitors 12a and b is accomplished through the primary transformer winding 16P and the resulting charging and discharging currents each are restricted to such a value that the primary winding has its ampere turns equal to that provided by the load current flowing through the secondary winding.

On the one hand, the commutation transformer 42 functions to divide the charging or discharging current into two equal parts flowing toward the sides of the thyristors 10a and b respectively. In other words, the commutation transformer 42 serves as an auto-transformer for doubling a voltage.

On the other hand, the transformer 16 has a turn ratio predetermined so that the charging or discharging current for the capacitor 12a or 12b flowing through the side of the thyristor 10a has a value of $(1 + n)I$ somewhat greater than the load current I to be commutated flowing through the saturable reactor 40a and the secondary transformer winding 16S. That is, the transformer 16 is designed and constructed such that a current having a value of $2(n + 1)I$ flows through the primary winding 16P thereof in consideration of the commutation transformer 42 halving the current.

After the potential at the junction of the capacitors 12a and b has been equal to the potential at the center tap on the commutation transformer 42, the current having the value of $2(1 + n)I$ continues to flow through the primary transformer winding 16P by virtue of a flow of load current I through the secondary transformer winding 16S. Thus the capacitors 12a and b continue to charge and discharge respectively.

Under these circumstances, the magnetic flux level of the transformer 16 ascends from its negative saturated region through its unsaturated region. After the capacitors 12a and b have reached the equally charged state, the flux level is again moved toward the negative saturated region until it reaches that region. At that time the capacitor 12a has charged to the source voltage while the capacitor 12b has fully discharged resulting in the completion of one commutation cycle. In that commutation cycle the thyristor 10a is reversely biased to be maintain in its OFF state and the saturable reactor and commutation transformer 40b and 42 respectively are adapted to be unsaturated.

From the foregoing it will be appreciated that the arrangement of FIG. 13 performs the commutation operation on the basis of the principles of the invention as already described in conjunction with FIGS. 6a and b.

When the load current is inverted in polarity, the saturable reactor 40b is saturated with negative polarity and the transformer 16 is in its positive saturated state. Meanwhile, the commutation transformer 42 and the saturable reactor 40a result in the resetting of the magnet flux to be ready for the succeeding commutation. Then the thyristor 10a is fired to repeat the process as above described.

Figure 14:
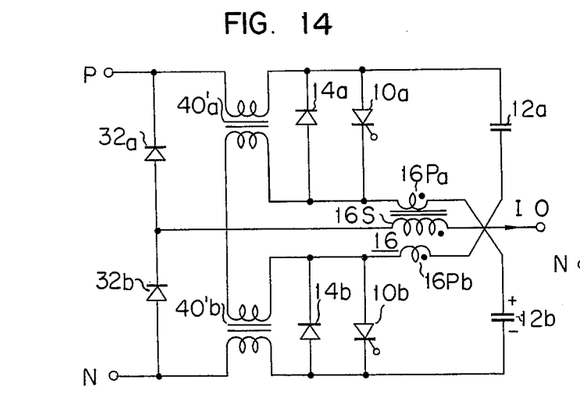

The arrangement of FIG. 14 is different from that shown in FIG. 13 principally in the construction of the inductive elements involved but it is equivalent in operation to the latter arrangement. Specifically, the control transformer 16 includes a pair of primary windings 16Pa and 16Pb connected to the respective thyristors 10a and 10b, and each of the saturable reactors 40a or b shown in FIG. 13 is magnetically coupled to the associated portion of the commutation transformer 42 to be incorparated into a single transformer 40'a or b.

Where the thyristor 10 is in its conducting state, the output terminal 0 has load current I supplied thereto while the capacitor 12b is in its charged state with the polarity illustrated. Upon firing the thyristor 10b, the capacitors 12a and b charge and discharge respectively through a current path including     capacitor 12b - primary transformer winding 16Pa - thyristor 10a or diode 14a - capacitor 12a - primary transformer winding 16Pb - thyristor 10b.

resulting charging and discharging currents are controlled with the load current I to be commutated whereby the commutation is effected in the manner as already described in conjunction with FIGS. 6a and b.

Figures 15A, 15B, 16, 17, 19A:
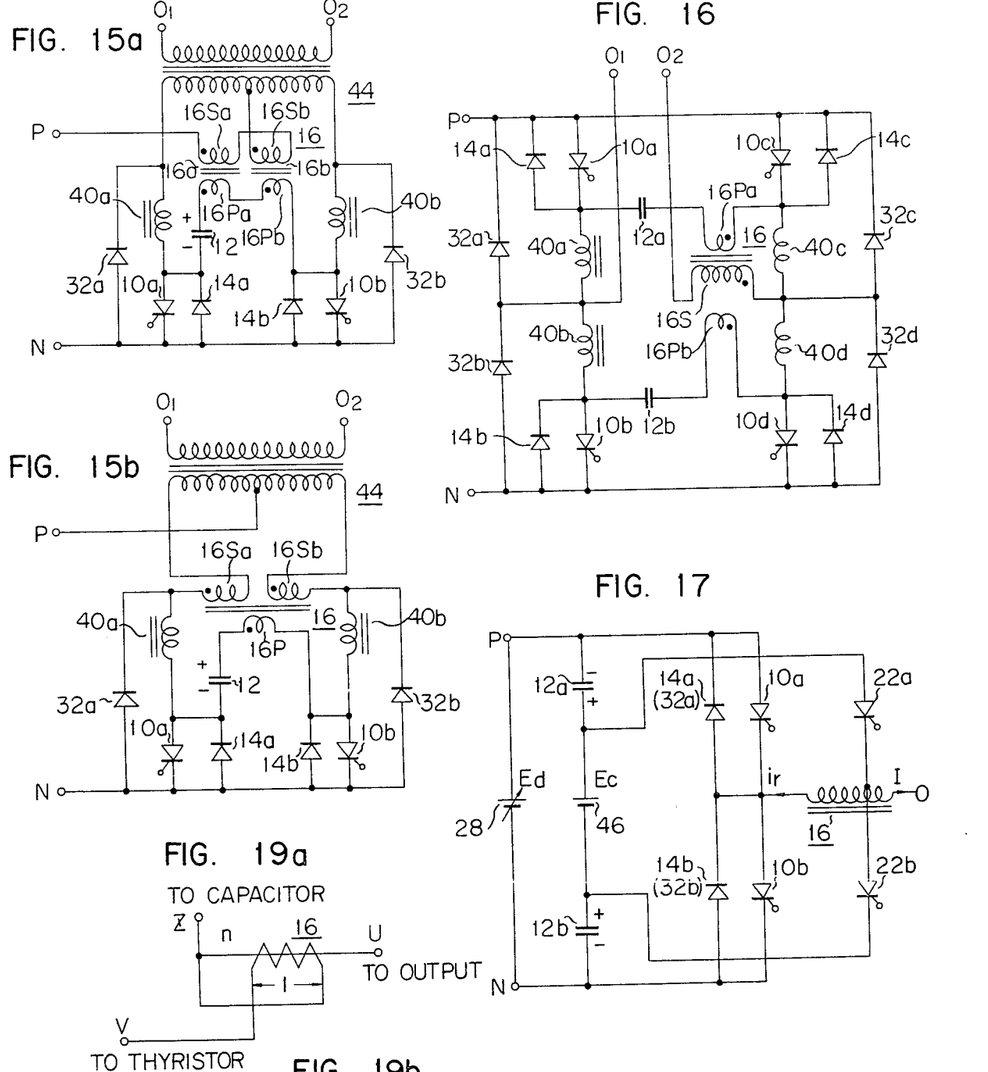

In the arrangement shown in FIG. 15a, the thyristors 10a and b along with the associated diodes 14a and b are at a common potential on the negative terminal N. A center tapped output transformer 44 is operatively coupled to the thyristors 10a and b through respective control transformer 16a and b with the commutation capacitor 12 connected between the thyristor and transformer 10a and 16a respectively. As shown by the dot convention, the transformers 16a and b are electrically interconnected so that both primary windings 16Pa and b are serially connected to each other with similar polarity and both secondary windings 16Sa and b are serially connected to each other with the opposite polarity.

In the arrangement, a current flowing through the DC input path corresponds to a load current to be commutated which is, in turn, utilized to self-bias the transformers 16a and b by having the secondary winding 16Sa and b in the DC input path.

When the capacitor 12 is charging with the illustrated polarity during the conduction of the thyristor 10a, the transformer 16a is negatively unsaturated while the transformer 16b is in its saturated state. Thus the transformer 16b is operative to control the charging current as previously described.

When the thyristor 10b is turned on, the transistor 16a is brought into its negative saturated state while the transformer 16b becomes unsaturated. Thus what is enabled is the transformer 16a rather than the transformer 16b.

FIG. 15b shows a modification of the arrangement of FIG. 15a. The two control transformers 16a and b as shown in FIG. 15a are replaced by a single control transformer including a common primary winding 16P and halved secondary windings 16Sa and b. In other respects the arrangement is identical to that shown in FIG. 15a.

FIG. 16 shows an arrangement of a bridge configuration formed by utilizing the arrangement of FIG. 15b.

The arrangement shown in FIG. 17 is somewhat different from the previously described arrangements in the provision of an auxiliary source of direct current for the commutation capacitor. As shown in FIG. 17, an auxiliary source of direct current 46 includes a positive side connected through the commutation capacitor 12 to the positive terminal P and a negative side through the commutation capacitor 12b to the negative terminal N of the main source 28. The main source 28 is of a variable voltage type and the auxiliary source 46 is of a fixed voltage type. The transformer 16 is connected through the intermediate tap thereon to the junction of the auxiliarily thyristors 22a and b rather than to the capacitor. In other respects, the arrangement is identical to that shown in FIG. 12.

Where the main thyristor 10a is in its conducting state, the auxiliary thyristor 22b was preliminarily turned on to charge the capacitor 12b with the polarity illustrated. The charged capacitor 12b turns off the thyristor 22b while putting the capacitor 12a in its charged state with the polarity illustrated.

Under these circumstances, the auxiliary thyristor 22a is fired in order to turn off the main thyristor 10a. This completes a closed loop including the main source 28 - capacitor 12a - auxiliary thyristor 22a - transformer 16 - output terminal 0 - load (not shown) - negative terminal N, and also a closed loop including     capacitor 12b - auxiliary source 46 - auxiliary thyristor 22a - transformer 16 - output terminal 0 - load (not shown) - negative terminal N.

Therefore the arrangement is put in its circuit configuration identical to that shown in FIG. 6 for commutation.

When the commutation has been completed, the control transformer 16 is saturated. Therefore the diode 14a also serving as the main diode 32a is enabled to circulate the load current through the load (not shown), the diode 14b and the saturated transformer 16.

Then, when the load current I is inverted in polarity, the main thyristor 10b is fired to saturate the control transformer 16 in the opposite direction whereby the load current with the opposite polarity is applied to the output terminal 0 and thence to the negative terminal N through the saturated transformer 16 and the thyristor 10b.

At the time when the commutation has been completed, the capacitor 12a charges with the polarity reversed from that illustrated as previously described in conjunction with FIG. 6. Similarly, the capacitor 12b charges with the polarity reversed from that illustrated but to a voltage having an absolute value greater the value of the voltage across the auxiliary source than the capacitor 12a. Thus the auxiliary thyristor 22b can be fired to turn off the main thyristor 10b in the similar manner as above described.

In the arrangement of FIG. 17, it will be therefore appreciated that either one of the capacitors can charge to a voltage higher the voltage across the auxiliary source than the main source voltage. Alternatively, it can discharge from the sum of the main and source voltages. This results in a sufficient commutation capability even if the main source is low in voltage. Accordingly, the arrangement is particularly suitable for use as inverter means by which a great change in voltage across a main DC source involved causes a great variation in AC output voltage.

Figure 18:
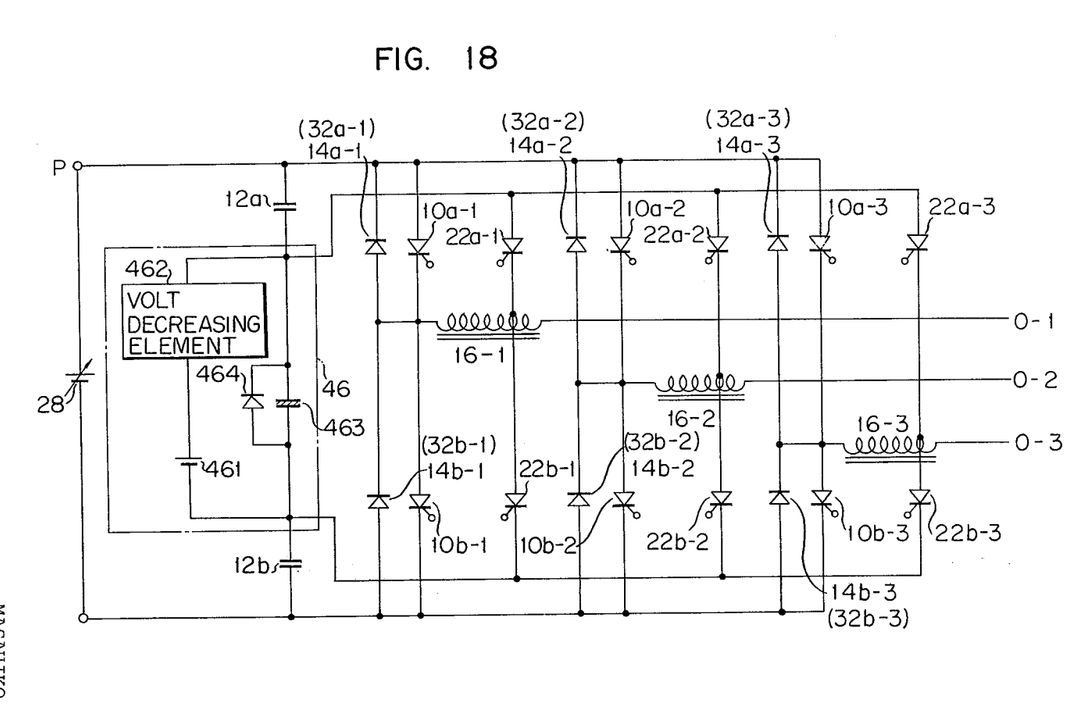

FIG. 18 shows a three-phase arrangement formed in accordance with the principles as above described in conjunction with FIG. 17 with the capacitors 12a and b common to three phases. Any component in each phase is designated by the reference numerals for the corresponding component in FIG. 17 suffixed with the digit 1, 2 or 3, representing that phase. For example, the main thyristor in phase 2 is designated by the reference numeral 10a - 2 or 10b - 2.

In the arrangement illustrated the auxiliary source 46 is adapted to decrease in voltage with an increase in voltage across the main source 28 and includes a source of direct current 461, a voltage decreasing element 462 serially connected to the source 462, a capacitor 463 and a semiconductor diode 464. The serially connected source and voltage decreasing element 461 and 462 respectively are connected across the capacitor 463 and also across the diode 464.

As apparent from the description for FIG. 17, the capacitor 12a and b are adapted to charge to and discharge from the sum of the main and auxiliary voltages. Therefore it the main source is high in voltage, then the charging and discharging voltages may exceed the required commutation capability. Such a high voltage is also applied to the auxiliary thyristor leading to the necessity of increasing the reverse voltage withstood thereby. In order to eliminate this objection, the auxiliary source 46 has been adapted to decrease in voltage in response to an increase in each of charging and discharging current for the capacitor resulting from an increase in voltage across the main source and from an increase in operating frequency due to the increase in main source voltage. This measure ensures that the capacitor voltage and the voltage applied to the auxiliary thyristor are prevented from increasing beyond the values required therefor.

Figure 19B:
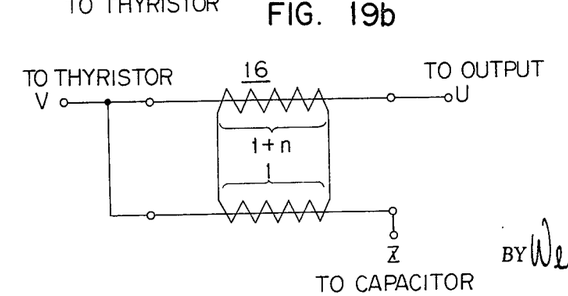

FIGS. 19a and b diagramatically show the control transformers which may be used in the invention.

In FIG. 19a, the control transformer 16 is shown as being an auto-transformer including several turns labelled 1 forming a primary winding and a single turn labelled n extending through the turns 1 corresponding to a difference between the primary and secondary winding of the control transformer. As shown in FIG. 19a, the single turn n has one end adapted to be connected to the output and the other end connected to one end of turns 1 and adapted to be connected to the capacitor. The other end of the turns 1 is adapted to be connected to the thyristor.

FIG. 19b shows another form of the control transformer 16 including a pair of auto-transformers such as shown in FIG. 19a interconnected so that the secondary windings thereof are connected in parallel to each other and each of the primary windings is formed of a single turn extending through the associated secondary winding and serially connected to the other primary winding. The series combination of the primary windings has one end adapted to be connected to the output and the other end adapted to be connected to the capacitor with the junction adapted to be connected to the thyristor. The secondary windings have a turn ratio of $(1 + n) : 1$ giving a transformation ratio of $1 : (1 + n)$ on the side of the extending turns, that is, of the resulting transformer.

The arrangements of FIGS. 19a and b are advantageous in that they can easily be manufactured for low voltage-high current applications. Also for low voltage-high current applications transformers are extremely small in turns and difficult to the turn ratio as desired. However, the arrangement of FIG. 19 is advantageous in that any desired turn ratio can be provided.

Therefore the arrangements of FIGS. 19a and b are particularly suitable for use in the invention applied to low voltage-high current power controls.

The invention has several advantages. For example, the commutation capacitor is greatly increased in its coefficient of utilization by means a simple construction because the control transformer is self-biased with a current flowing through the main thyristor itself leading to the self-control of the charging and discharging currents for the capacitor. The capacitor is also permitted to decrease in capacitance. Further the present circuit is low in commutation loss and has a high efficiency at higher operating frequencies. As above described, by providing clamping means cooperating with the diode connected in opposite parallel circuit relationship with the thyristor during the unsaturation of the control transformer to clamp the reverse voltage induced across the primary winding of the transformer, the control transformer can reversely bias the thyristor by itself, resulting in an increase in the commutation capability.

While the invention has been illustrated and described in conjunction with several preferred embodiments thereof it is to be understood that numerous changes and modification may be resorted to without departing from the spirit and scope of the invention. For example, the commutation capacitor may be replaced by an active element for passing the forward current from the main thyristor. Also in order to omit the diode through which the reverse current for the main thyristor flows, the thyristor may be of bi-directional type well known. Alternatively the thyristor may have those portion through which such a reverse current flows, in the form of an integrated circuit disposed therein.

What is claimed is:

1. A commutation circuit comprising:
semiconductor controlled rectifier means connected between a source of direct current and a load, said semiconductor controlled rectifier means comprising a parallel combination of a first semiconductor controlled rectifier and a rectifier element in a reverse direction to said semiconductor controlled rectifier;
a capacitor member operatively coupled to said semiconductor controlled rectifier means to provide means for imparting a reverse bias to said semiconductor controlled rectifier means; and
a transformer member having a primary transformer winding and a secondary transformer winding, said primary winding being serially connected to said capacitor member and the sense of said windings being such that said secondary winding comprises means for biasing magnetomotive force of a reverse polarity from a magnetomotive force produced in response to reverse bias current flowing through said primary winding and for limiting said reverse bias current by means of said bias magnetomotive force during the deenergization of said semiconductor rectifier means and at least in an unsaturated state of said transformer member.

2. A commutation circuit as claimed in claim 1, wherein a load current flows through said secondary winding of said transformer member for biasing said transformer member.

3. A commutation circuit as claimed in claim 2, wherein said transformer member comprises an autotransformer including an intermediate tap connected to said capacitor member and a secondary winding serially connected in a load current path.

4. A commutation circuit as claimed in claim 1, further comprising biasing current source means for imparting a biasing current to said secondary winding of said transformer member, said biasing current being independent of a load current.

5. A commutation circuit comprising:
semiconductor controlled rectifier means connected between a source of direct current and a load, said semiconductor controlled rectifier means comprising a parallel combination of a semiconductor controlled rectifier and a rectifier element in a reverse direction to said semiconductor controlled rectifier;
a capacitor member operatively coupled to said semiconductor controlled rectifier means to provide means for bypassing a forward current for said semiconductor controlled rectifier means; and
a transformer member having a primary transformer winding and a secondary transformer winding, said primary winding being serially connected to said capacitor member, the sense of said windings being such that said secondary winding comprises means for biasing magnetomotive force of a reverse polarity from a magnetomotive force produced in response to bypassed current flowing through said primary winding and for limiting said bypassed current by means of said bias magnetomotive force during denergization of said semiconductor rectifier means and at least in an unsaturated state of said transformer member.

6. A commutation circuit as claimed in claim 5, wherein a load current flows through said secondary winding of said transformer member for biasing said transformer member.

7. A commutation circuit as claimed in claim 6, wherein said transformer member comprises an autotransformer including an intermediate tap connected to said capacitor member and a secondary winding serially connected in a load current path.

8. A commutation circuit comprising:
semiconductor controlled rectifier means connected between a source of direct current and a load, said semiconductor controlled rectifier means comprising a reverse conducting controlled rectifier;
a capacitor means operatively coupled to said semiconductor controlled rectifier means to provide means for imparting a reverse bias to said semiconductor controlled rectifier means; and
a transformer member having a primary transformer winding and a secondary transformer winding, said primary winding being serially connected to said capacitor means, the sense of said windings being such that said secondary winding comprises means for biasing magnetomotive force of a reverse polarity from a magnetomotive force produced in response to reverse bias current flowing through said primary winding and for limiting said reverse bias current by means of said bias magnetomotive force during deenergization of said semiconductor rectifier means, the required value of said capacitor means being thereby decreased.

9. A commutation circuit as claimed in claim 8, wherein a load current flows through said secondary winding of said transformer member for biasing said transformer member.

10. A commutation circuit as claimed in claim 8, further comprising biasing current source means for imparting a biasing current to said secondary winding of said transformer means, said biasing current being independent of a load current.

11. A commutation circuit comprising:
semiconductor controlled rectifier means connected between a source of direct current and a load, said semiconductor controlled rectifier means comprising a reverse conducting controlled rectifier;
a capacitor means operatively coupled to said semiconductor controlled rectifier means to provide means for bypassing a forward current for said semiconductor controlled rectifier means; and
a transformer member having a primary transformer winding and a secondary transformer winding, said primary winding being serially connected to said capacitor means, the sense of said windings being such that said secondary winding comprises means for biasing magnetomotive force of a reverse polarity from a magnetomotive force produced in response to bypassed current flowing through said primary winding and for limiting said bypassed current by means of said bias magnetomotive force during denergization of said semiconductor rectifier means, the required value of said capacitor means being thereby decreased.

12. A commutation circuit as claimed in claim 11, wherein a load current flows through said secondary winding of said transformer member for biasing said transformer member.

13. A commutation circuit as claimed in claim 11, further comprising biasing current source means for imparting a biasing current to said secondary winding of said transformer member, said biasing current being independent of a load current.

* * * * *